March 31, 1959 R. C. KOCH 2,880,312

TRANSISTOR OSCILLATOR-MIXER WITH RECEIVED AND LOCAL OSCILLATIONS APPLIED BETWEEN EMITTER AND BASE

Filed Feb. 2, 1955 2 Sheets-Sheet 1

INVENTOR.
RICHARD C. KOCH
BY
George R. Gust
ATTORNEY

March 31, 1959 R. C. KOCH 2,880,312

TRANSISTOR OSCILLATOR-MIXER WITH RECEIVED AND LOCAL OSCILLATIONS APPLIED BETWEEN EMITTER AND BASE

Filed Feb. 2, 1955 2 Sheets-Sheet 2

INVENTOR.
RICHARD C. KOCH
BY
George R. Gust
ATTORNEY 2,880,312
Patented Mar. 31, 1959

2,880,312

TRANSISTOR OSCILLATOR-MIXER WITH RECEIVED AND LOCAL OSCILLATIONS APPLIED BETWEEN EMITTER AND BASE

Richard C. Koch, Indianapolis, Ind., assignor to I.D.E.A., Inc., Indianapolis, Ind.

Application February 2, 1955, Serial No. 485,757

10 Claims. (Cl. 250—20)

The present invention relates to a frequency converter, and more particularly to a combination oscillator and mixer circuit of the character conventionally used in superheterodyne receivers for developing the necessary intermediate frequency signal.

In conventional superheterodyne receivers, the radio frequency signal obtained from the antenna is coupled directly to a radio frequency tuning or amplifying circuit. An oscillator of suitable design for generating a signal of proper frequency is coupled to a frequency converting or mixer circuit, as is the radio frequency signal which is supplied by the aforementioned tuning or amplifying circuit. The oscillator and radio frequency signals are mixed or heterodyned in the mixer circuit to produce a difference frequency or beat frequency between the two signals. This difference frequency, commonly characterized in the art as an intermediate frequency, is the arithmetic sum or difference of the frequencies of the heterodyned signals, this frequency being the one usually utilized for subsequent amplification.

The present invention functions to produce this intermediate frequency for utilization by the usual intermediate frequency amplifying, detecting and audio amplifying circuits of a superheterodyne receiver. As in the conventional case, the invention operates to mix or convert oscillator and radio frequency signals for producing an intermediate frequency signal.

An object of the invention is to provide an oscillator-mixer circuit for producing an intermediate frequency signal by the use of only a single electron-amplifying device, such as a transistor.

Another object of this invention is to provide an oscillator-mixer circuit for producing an intermediate frequency signal wherein the usual, separate oscillator and mixer circuits are combined into a single circuit wherein the component parts of the circuit conjointly function in the operation of both circuits.

Other objects will become apparent as the description proceeds.

In accordance with a specific embodiment of this invention, there is provided a frequency conversion apparatus comprising two signal circuits, first means for applying a first alternating voltage signal to one circuit, second means for applying a second alternating voltage signal to the other circuit, a non-linear unidirectionally conducting device (having a control element or elements) operatively coupled to both circuits, and means including said device for converting said first and second signals into a signal having a frequency that is utilized by succeeding amplifiers or the like. The resultant signal-frequency usually employed is that which is the difference between the first and second signals; however, different harmonics and the resultant sums or differences thereof may be similarly employed.

To the accomplishment of the above and related objects, my invention may be embodied in the forms illustrated in the accompanying drawings, attention being called to the fact, however, that the drawings are illustrative only, and that specific change may be made in the specific constructions illustrated and described, so long as the scope of the appended claims is not violated.

Figure 1:
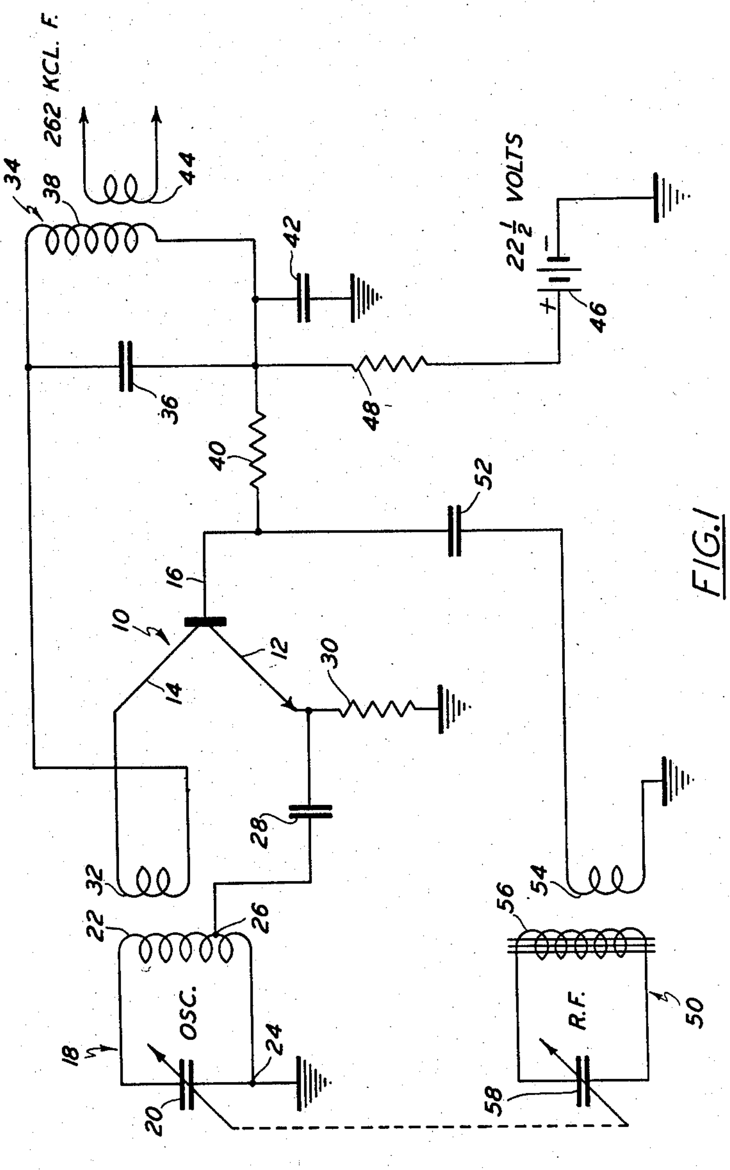
Fig. 1 is a diagram of a working embodiment of this invention.

With reference to the drawings, and more particularly to Fig. 1, the oscillator-mixer circuit of this invention comprises a single conventional transistor 10 having emitter, collector, and base elements 12, 14 and 16, respectively. These elements are coupled into a self-excited oscillator circuit comprising the usual resonant tank circuit 18 having a variable condenser 20 connected in shunt with a tank inductance 22. This tank circuit 18 is grounded at 24. The inductance 22 is tapped at 26 a suitable distance from the ground end for coupling to the emitter 12 by means of a coupling capacitor 28. Biasing resistor 30 is connected between the emitter 12 and ground or may be connected across capacitor 28. The usual feedback coil 32 is inductively coupled to the tank coil 22 and is connected in such polarity between the collector 14 and ground to sustain oscillations. Series connected with the feedback coil 32 is an intermeditae frequency transformer 34 which is composed of the usual shunt-connected condenser 36 and primary winding 38. The lower end of the winding 38 is connected to ground by means of a capacitor 42. The secondary winding of the transformer 34 is designated by the reference numeral 44. A battery 46 supplies positive voltage to the lower end of the transformer 34 through a suitable decoupling resistor 48.

The circuit thus far described operates as a conventional oscillator. In order to achieve this operation, it is necessary that the path leading from the feedback coil 32 to ground presents no more than negligible impedance to the oscillator signal, and this is accomplished by selecting the impedance of the I.F. transformer at the oscillation frequency such that only a low or negligible impedance will be presented to the flow of oscillator signal currents appearing between the collector and ground. Thus in understanding the operation of the oscillator, the intermediate frequency transformer 34 may be considered as a short circuit, whereupon the resulting oscillator is at once understood to be conventional.

The parameters of the intermediate frequency transformer 34 which includes the condenser 36, and the primary and secondary windings 38 and 44, respectively, are selected to provide a high impedance or resonant circuit at the frequency of the intermediate frequency signal.

Thus, two conditions necessary for the proper operation of this invention have now been given, viz., (1) the intermediate frequency transformer 34 can present only low or negligible impedance to the passage of oscillator signals, but (2) must present a high resonant impedance condition to the difference or intermediate frequency signal.

The operation of the oscillator circuit may now be explained. The resistor 30 performs the functions of providing a bias voltage for the emitter element 12 and stabilizing flow of current. The feedback winding 32 being coupled in series with the collector element 14, a current flowing between the emitter and collector elements will pass through the feedback coil 32. Because of the mutual inductive relationship between the coils 22 and 32, a voltage will be generated in the tank circuit 18 and by virtue of tap 26 a voltage is applied between the emitter and base elements, this voltage controlling the electron current flowing in the collector element in the usual manner to augment this latter current. From this, it is seen that the oscillator circuit corresponds to an amplifier having the usual feedback coupling which produces self-sustaining oscillations.

While a particular oscillator circuit has been described in connection with explaining this invention, it will be understood by persons skilled in the art that any oscillator circuit may be used without departing from the scope of this invention.

The mixer circuit portion of this invention will now be described. It includes all of the circuit components previously described with the exception of the tank and feedback circuits 18 and 32, respectively. In addition, a radio frequency tuning circuit 50 is coupled to the base element 16 by means of a coupling condenser 52 and a winding 54. The circuit 50 is composed of a suitable coil 56 which is connected in parallel with a variable condenser 58. The parameters of this circuit 50 are selected to resonate or tune to a received radio frequency signal which is preferably coupled to the circuit by means of an antenna in the form of the coil 56. This antenna is conventionally comprised of the coil 56 wound on a ferrite core. However, it will be obvious to a person skilled in the art that any type of antenna may be used for coupling a signal to circuit 50.

With reference to specific circuit parameters, since the coil 54 appears in the base element 16 circuit of the oscillator, it is necessary that it present only a low or negligible impedance to the oscillator and intermediate frequency signals. Thus, insofar as oscillator operation is concerned, the coil 54 may be considered a short circuit.

The oscillator feedback circuit 32 must be so selected as to present only low or negligible impedance to intermediate frequency signals whereupon the coil 32 will not affect mixer circuit operation. Insofar as operation of the mixer circuit is concerned, the coil 32 may be considered a short circuit.

At the frequency of the radio frequency signal, the load connected in the oscillator collector circuit must be of low or negligible impedance (this load includes coil 32 and transformer 34). Similarly, at such radio frequency, the load connected in the mixer collector circuit must be of low order impedance (this load includes coil 32 and transformer 34).

Having now described the complete circuit in detail and the operation of the oscillator, the operation of the mixer circuit will now be given. A radio frequency signal applied to the circuit 50 is applied by means of the coil 54 across the transistor elements 12 and 16, respectively, along with oscillator voltages already present. The current normally flowing in the collector element is controlled by the combination of the two voltages appearing between the base element 16 and emitter element 12 whereupon the current which flows from the collector element 14 through the coil 32 and through the intermediate frequency transformer 34 will have a value depending upon the instantaneous value of voltage applied between base 16 and emitter 12. Considering the coil 32 to be a short circuit, it is immediately understood that mixer circuit operation is conventional and conforms to circuits well-known in the art.

The two condensers 20 and 58 are gang-tuned in the usual manner such that the sum or difference frequency (intermediate frequency) between the oscillator and received radio frequency signals is a constant. This intermediate frequency signal appears in the output circuit 44 of the transformer 34, and may be utilized for amplification by the usual intermediate frequency amplifiers.

Considering the oscillator section of the circuit of Fig. 1, it will be noted that it is of the commonly defined "common-base" configuration, the oscillator input circuit being connected across the emitter 12 and base 16, respectively, and the oscillator output circuit being connected across the collector 10 and the base 16, respectively.

In this embodiment the oscillator input circuit may be considered as the inductor portion 24—26, with oscillator signal being injected into the emitter element through capacitor from the tap 26. The point 24 on the inductor is returned to the base through ground, the negligible impedance of coil 54 and capacitor 52.

The oscillator output circuit may be considered as the feedback coil 32 which is returned to the base through capacitors 42 and 52 and the negligible impedances of the intermediate frequency tank circuit 34 and coil 54.

Since the input and output circuitry have the base element as a common reference potential, the application of the nomenclature common-base oscillator circuit is quite appropriate.

In the illustrated embodiment, the mixer input circuit may be considered as the winding 54 from which the radio frequency signal is injected into the base element through capacitor 52. The negligible impedance of inductor portion 24—26, capacitor 28, and ground return the grounded end of inductor 54 to the emitter element. Radio frequency signal is therefore injected between the base and emitter elements. The mixer output circuit is the intermediate frequency tank circuit 34. The impedance of the inductor 32 is negligible at intermediate frequencies therefore the collector element is connected directly to one end of the intermediate frequency tank circuit 34. The other end of the intermediate frequency tank circuit 34 is returned to the emitter element through capacitor 42, ground, and the low impedance of inductor section 24—26 and capacitor 28.

Such terms as "common-base," "common-emitter" and "common-collector" and the significance of the circuit configurations represented thereby are well understood and defined in the art; for example, see "Handbook of Semi-Conductor Electronics," by Hunter, first ed., 1956, published by McGraw-Hill Book Co., Inc., and "Transistor Electronics," by Lo, Endres, Zawels, Waldhauer & Cheng, 1955, published by Prentice-Hall, Inc., as typical references.

From the foregoing, it will now be appreciated that a single electron-amplifying device such as a vacuum tube or the transistor 10 may be so arranged in a single circuit which performs the dual functions of providing a reference oscillator signal and mixing this signal with a radio frequency signal for obtaining an intermediate frequency signal. Prior art devices have used separate oscillator and mixer circuits which utilize separate vacuum tubes or transistors. The present invention combines the two previously known circuits in such a manner as to achieve the identical performance and reliability of operation by the use of only a single tube or transistor and by the use of essentially only a single circuit which is no more complex than the previous oscillator or mixer circuits.

Figure 2:
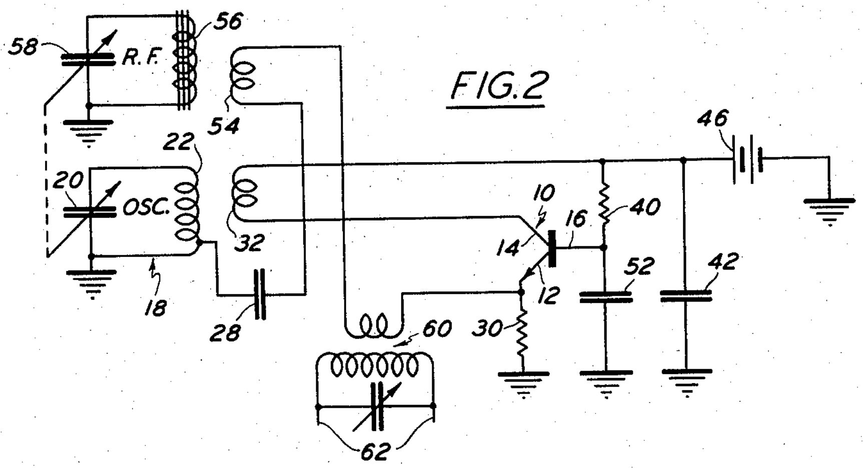
Fig. 2 is a circuit diagram of a different embodiment.
Figure 3:
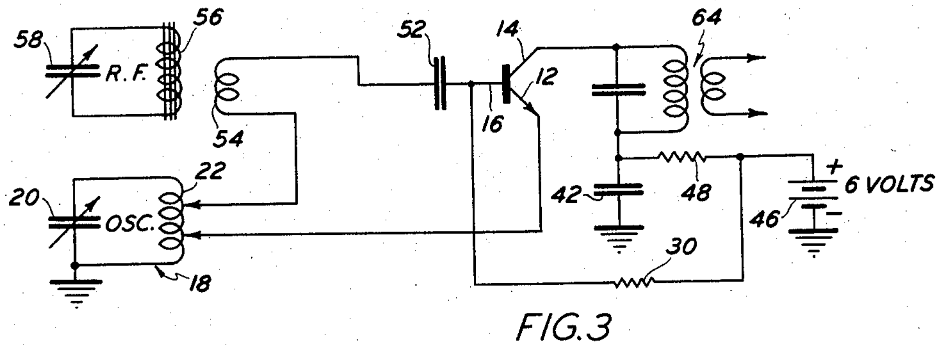
Fig. 3 is a circuit diagram of still another embodiment.

Alternative embodiments of this invention are illustrated in Figs. 2 and 3. Like numerals will indicate like parts. In Fig. 2, the intermediate frequency transformer 60 is coupled in series with the emitter 12 and the inductor 22 such that the difference frequency is supplied by the transformer terminals 62. Oscillator and mixer operation is the same as previously described with the exception that the performance of this circuit is not as good at commercial broadcast frequencies as is the case with the embodiment of Fig. 1. These broadcast frequencies are considered to be those ranging from 550 kilocycles to 1500 kilocycles.

In the embodiment of Fig. 3, it will be noted that the intermediate frequency transformer 64 is connected in series with the collector element 14. The feedback coil 32 of Figs. 1 and 2 is eliminated, and the oscillator coil 18 is tapped as required for proper operation. The secondary coil 54 is connected to the oscillator coil 18. Comparison of this circuit with the preceding embodiments reveals a further simplification.

Figure 4:
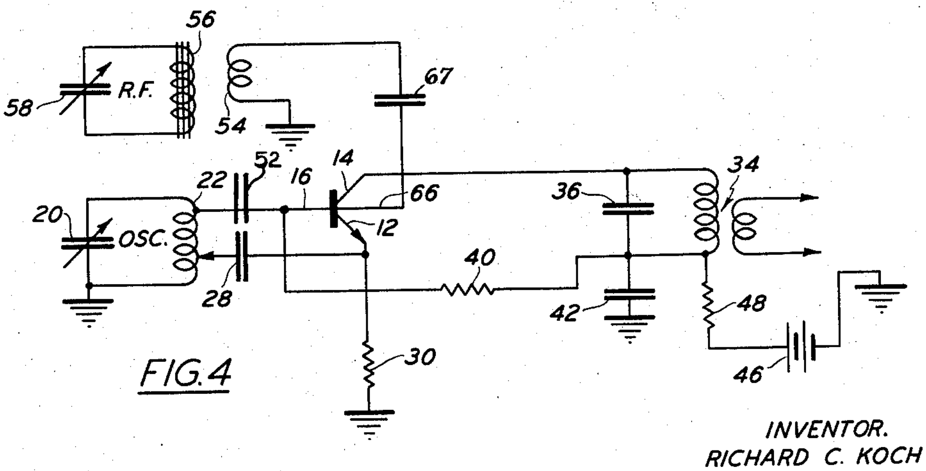
Fig. 4 is a circuit diagram of a tetrode embodiment.

With reference to Fig. 4, the transistor device is a tetrode having in addition to the emitter, collector and base elements a tetrode element 66 which is coupled by condenser 67 to the coil 54. The base element 16 is coupled by condenser 52 to a point near one end of the oscillator coil 22 and emitter 12 is coupled by means of condenser 28 to a point on the oscillator coil 22 intermediate the base coupling and the end. The circuit requirements of this embodiment are essentially the same as those of the preceding embodiments and the condenser 28 is tapped at the point on coil 22 which achieves proper circuit operation.

One advantage gained through the use of this tetrode arrangement is the fact that better isolation between the radio frequency and oscillator circuits is achieved, since the radio frequency signal is injected into the system by means of the tetrode element 66.

While it will be understood that the circuit specifications of the oscillator-mixer circuit of the invention may vary according to the design for any particular application, the following circuit specifications for an oscillator-mixer circuit of Fig. 1 are included, by way of example only, as suitable for use in a superheterodyne receiver receiving signals in the frequency range of 550 kilocycles to 1500 kilocycles.

| | |
|---|---|
| Intermediate frequency | 262 kilocycles. |
| Device **10** | NPN transistor. |
| Condenser **28** | 0.01 mfd. |
| Resistor **30** | 10,000 ohms. |
| Condenser **36** | 220 mmfd. |
| Resistor **40** | 330,000 ohms. |
| Condenser **42** | 0.001 mfd. |
| Battery **46** | 22.5 volts. |
| Resistor **48** | 2700 ohms. |
| Condenser **52** | 0.01 mfd. |

What is claimed is:

1. Frequency conversion apparatus comprising oscillator and mixer circuits, a transistor having collector, emitter and base elements which are all operatively coupled into both circuits, said transistor serving in conjunction with said oscillator circuit to produce an oscillator signal of predetermined frequency; said oscillator circuit including a resonant tank circuit having an inductor and capacitor connected in parallel, said emitter element being capacitively coupled to a point on said inductor intermediate the ends thereof, one end of said inductor being connected to a source of reference potential, a first capacitance connected between said base element and said source of reference potential, a load inductance connected in series with said collector element and inductively coupled to said tank circuit in regenerative feedback relation, a second capacitance operatively coupled in series with said load inductance and said source of reference potential; said mixer circuit including a source of signal voltage at a predetermined frequency coupled in series with said reference potential source and said first capacitance, an output transformer coupled in series with and between said load inductance and said second capacitance; said transformer being tuned to a predetermined intermediate frequency obtained by mixing said oscillator signal with said signal voltage, and means for biasing said elements.

2. The apparatus of claim 1 wherein the capacitor of said tank circuit is variable; said source of signal voltage comprising an input signal transformer having primary and secondary windings, said secondary winding being connected in series with said reference-voltage source and said first capacitance, and a variable capacitor coupled in parallel with said primary winding, both said variable capacitors being gang tuned.

3. Frequency conversion apparatus comprising a transistor having collector, emitter and base elements, a source of carrier signal, means coupled to said source applying said carrier signal across said emitter and base elements, said carrier signal having a predetermined frequency, a resonant tank circuit tuned to a frequency different from said predetermined frequency for developing an oscillator signal of a given frequency, a feedback circuit coupled to said tank circuit in feedback relationship to provide regenerative feedback for said transistor, means coupled to said feedback circuit applying said regenerative feedback to said feedback circuit from across said collector and base elements, means applying said oscillator signal across said base and emitter elements, respectively, a second resonant circuit tuned to the intermediate frequency of said carrier and oscillator signal frequencies for providing an intermediate frequency signal, means coupled to said second resonant circuit applying said intermediate frequency signal to said second resonant circuit from across said collector and emitter elements, and means biasing said elements.

4. Frequency conversion apparatus comprising a transistor having collector, emitter and base elements, a source of carrier signal, means coupled to said source applying said carrier signal across said emitter and base elements, said carrier signal having a predetermined frequency, a resonant tank circuit tuned to a frequency different from said predetermined frequency for developing an oscillator signal of said different frequency, means coupled to said resonant tank circuit applying said oscillator signal across said base and emitter elements, respectively, circuit means connected across said collector and base elements providing a feedback signal, said circuit means being regeneratively coupled to said resonant tank circuit to provide regenerative feedback for said transistor, a second resonant circuit tuned to the intermediate frequency of said carrier and oscillator signal frequencies for providing an intermediate frequency signal, means coupled to said second resonant circuit applying said intermediate frequency signal to said second resonant circuit from across said collector and emitter elements, and means biasing said elements.

5. A frequency converter comprising a transistor having collector, emitter and base elements; first means for biasing said elements; a source of carrier signal at a predetermined frequency; said source being series-connected between said base element and a source of reference potential; a first resonant circuit tuned to a frequency different from said predetermined frequency for developing an oscillator signal of a given frequency; a first signal-conducting connection connected to said emitter element, a second signal-conducting connection connected to said base, second means coupling said resonant circuit to said first and second signal-conducting connections whereby at least a portion of the signal in said resonant circuit is applied across said emitter and base elements; a feedback inductor coupled to said resonant circuit; a second resonant circuit tuned to a predetermined intermediate frequency obtained by mixing said carrier signal with said oscillator signal; a connection including said second means between said emitter element and said source of reference potential having low impedance at said intermediate frequency; said feedback inductor and said second resonant circuit being connected in series between said collector element and said source of reference potential thereby impressing regenerative feedback on said transistor.

6. A frequency converter comprising a transistor having collector, emitter and base elements; means for biasing said elements; a first coupling capacitor; a source of carrier signal at a predetermined frequency; one side of said capacitor connected to said base element; said source being series-connected between the other side of said capacitor and a source of reference potential; a first resonant circuit tuned to a frequency different from said predetermined frequency for developing an oscillator signal of a given frequency; means for coupling said resonant circuit across said emitter and base elements; a feedback inductor coupled to said collector element to impress regenerative feedback on said transistor; a second resonant circuit tuned to a predetermined intermediate frequency obtained by mixing said carrier signal with said oscillator signal; and a second coupling capacitor; one end of said feedback inductor connected to said collector element; said second resonant circuit being series-connected between the other end of said feedback inductor and one side of said second capacitor; the other side of said second capacitor being connected to said source of reference potential.

7. A frequency converter comprising a transistor having collector, emitter and base elements; means for biasing said elements; a signal inductor for providing a source of carrier signal at a predetermined frequency; one end portion of said signal inductor being connected to a source of reference potential; the other end portion of said signal inductor being coupled to said base element; a first resonant circuit tuned to a frequency different from said predetermined frequency for developing an oscillator signal of a given frequency; means for coupling said resonant circuit across said emitter and base elements; a feedback inductor coupled to said resonant circuit and to said collector element to impress regenerative feedback on said transistor; a second resonant circuit tuned to a predetermined intermediate frequency obtained by mixing said carrier signal with said oscillator signal; and a second coupling capacitor; said feedback inductor, said second resonant circuit, and said second coupling capacitor being connected in series between said collector element and said source of reference potential.

8. A frequency converter comprising a transistor having collector, emitter and base elements; first means for biasing said elements; a source of carrier signal at a predetermined frequency; said source being series-connected between said base element and a source of reference potential; a first resonant circuit tuned to a frequency different from said predetermined frequency for developing an oscillator signal of a given frequency; a resistor connected between said emitter element and said source of reference potential; a coupling capacitor connected to said emitter element; second means coupling said resonant circuit to said capacitor and to said base element; a feedback inductor coupled to said resonant circuit, a second resonant circuit tuned to a predetermined intermediate frequency obtained by mixing said carrier signal with said oscillator signal; a connection including said second means between said emitter element and said source of reference potential having low impedance at said intermediate frequency; said feedback inductor and said second resonant circuit being connected in series between said collector element and said source of reference potential thereby impressing regenerative feedback on said transistor.

9. A frequency converter comprising a transistor having collector, emitter and base elements; means for biasing said elements; a first coupling capacitor; a signal inductor for providing a source of carrier signal at a predetermined frequency; said capacitor and said inductor being series-connected between said base element and a source of reference potential; a first resonant circuit tuned to a frequency different from said predetermined frequency for developing an oscillator signal of a given frequency; a resistor connected between said emitter element and said source of reference potential; a second capacitor connected to said emitter; means for coupling said resonant circuit to said second capacitor and to said base element to impress at least a portion of the signal in said resonant circuit across said emitter and base elements; a feedback inductor coupled to said resonant circuit and to said collector element to impress regenerative feedback on said transistor; a second resonant circuit tuned to a predetermined intermediate frequency obtained by mixing said carrier signal with said oscillator signal; and a third coupling capacitor; said second resonant circuit being series-connected with said collector element, said feedback inductor, said third capacitor, and said source of reference potential.

10. A frequency converter comprising a transistor having collector, emitter and base elements; means for biasing said elements; a first coupling capacitor; a first resonant circuit turned to a predetermined frequency for providing a source of carrier signal; a first inductor coupled to said first resonant circuit; said capacitor and said first inductor being series-connected between said base element and a source of reference potential; a second resonant circuit including a second inductor and tuned to a frequency different from said predetermined frequency for developing an oscillator signal of a given frequency; one end portion of said second inductor being connected to said source of reference potential; a point on said second inductor intermediate the ends thereof being capacitively coupled to said emitter element; a stabilizing resistor connected between said emitter element and said source of reference potential; a feedback inductor coupled to said collector element and to said second resonant circuit to impress regenerative feedback on said transistor; a third resonant circuit tuned to a predetermined intermediate frequency obtained by mixing said carrier signal with said oscillator signal; said third resonant circuit including a third inductor; and a second coupling capacitor; said feedback inductor, said third inductor, and said second coupling capacitor being connected in series between said collector element and said source of reference potential.

References Cited in the file of this patent

UNITED STATES PATENTS

| | | |
|---|---|---|
| 2,517,719 | Sands | Aug. 8, 1950 |
| 2,616,036 | Adler | Oct. 28, 1952 |
| 2,713,117 | Haegele | July 12, 1955 |
| 2,757,287 | Stanley | July 31, 1956 |

FOREIGN PATENTS

| | | |
|---|---|---|
| 506,781 | Belgium | Nov. 14, 1951 |

OTHER REFERENCES

"Miniature Transistor Radio," December 1954, pages 20 and 21, Electronic Design.

Sulzer: "Transistor Broadcast Regenerator," page 200, Electronics.